US010985216B2

(12) United States Patent
Soda

(10) Patent No.: US 10,985,216 B2
(45) Date of Patent: Apr. 20, 2021

(54) DISPLAY APPARATUS AND IMAGING APPARATUS

(71) Applicant: CANON KABUSHIKI KAISHA, Tokyo (JP)

(72) Inventor: Takehiko Soda, Yokohama (JP)

(73) Assignee: CANON KABUSHIKI KAISHA, Tokyo (JP)

(*) Notice: Subject to any disclaimer, the term of this patent is extended or adjusted under 35 U.S.C. 154(b) by 35 days.

(21) Appl. No.: 16/242,272

(22) Filed: Jan. 8, 2019

(65) Prior Publication Data

US 2019/0214439 A1 Jul. 11, 2019

(30) Foreign Application Priority Data

Jan. 10, 2018 (JP) .............................. JP2018-001601

(51) Int. Cl.
*H01L 27/32* (2006.01)

(52) U.S. Cl.
CPC ........ *H01L 27/3216* (2013.01); *H01L 27/322* (2013.01); *H01L 27/3218* (2013.01); *H01L 27/3262* (2013.01); *H01L 27/3265* (2013.01)

(58) Field of Classification Search
CPC ............. H01L 27/3216; H01L 27/3218; H01L 27/322; H01L 27/3262; H01L 51/5281; H01L 27/3265; H01L 27/3211–3218; G09F 9/33; G09G 3/3208

See application file for complete search history.

(56) References Cited

U.S. PATENT DOCUMENTS

| 8,446,092 | B2 | 5/2013 | Tomida et al. | |
|---|---|---|---|---|
| 8,610,348 | B2 | 12/2013 | Tomida et al. | |
| 8,723,416 | B2 | 5/2014 | Tomida et al. | |
| 8,921,866 | B2 | 12/2014 | Xi et al. | |
| 9,041,281 | B2 | 5/2015 | Tomida et al. | |
| 9,397,147 | B2 | 7/2016 | Tomida et al. | |
| 9,443,920 | B2 | 9/2016 | Noh et al. | |
| 9,666,656 | B2 | 5/2017 | Tomida et al. | |
| 9,716,116 | B1 | 7/2017 | Liu | |
| 9,978,815 | B2 | 5/2018 | Tomida et al. | |
| 2006/0113551 | A1* | 6/2006 | Kwak | G09G 3/3233 257/85 |

(Continued)

FOREIGN PATENT DOCUMENTS

| CN | 1862664 A | 11/2006 |
|---|---|---|
| CN | 1870277 A | 11/2006 |

(Continued)

OTHER PUBLICATIONS

Combined Search and Examination Report dated Jul. 25, 2019, in corresponding GB 1900224.5 (8 pages).

(Continued)

*Primary Examiner* — Jarrett J Stark
(74) *Attorney, Agent, or Firm* — Venable LLP

(57) ABSTRACT

A display apparatus comprises a pixel including a plurality of sub pixels. Each of the sub pixels includes a current driven light emitting device, a transistor for supplying an electric current to the light emitting device and a capacitive element for maintaining a gate voltage of the transistor. The capacitive element of one sub pixel and the capacitive element of the other sub pixel at least partially overlap each other.

16 Claims, 8 Drawing Sheets

(56) References Cited

U.S. PATENT DOCUMENTS

| | | |
|---|---|---|
| 2007/0236623 A1 | 10/2007 | Heo et al. |
| 2008/0036933 A1* | 2/2008 | Na .................... G02F 1/13624 349/38 |
| 2009/0315814 A1 | 12/2009 | Tomida et al. |
| 2011/0149184 A1* | 6/2011 | Tsai .................. G02F 1/136213 349/38 |
| 2011/0156993 A1* | 6/2011 | Ting .................... G09G 3/3648 345/87 |
| 2013/0241403 A1 | 9/2013 | Tomida et al. |
| 2014/0070694 A1 | 3/2014 | Tomida et al. |
| 2014/0209882 A1 | 7/2014 | Tomida et al. |
| 2014/0319546 A1 | 10/2014 | Xi et al. |
| 2015/0279872 A1* | 10/2015 | Kato .................. H01L 27/1255 257/43 |
| 2015/0279910 A1 | 10/2015 | Tomida et al. |
| 2016/0125789 A1 | 5/2016 | Choi et al. |
| 2016/0307984 A1 | 10/2016 | Tomida et al. |
| 2017/0162643 A1* | 6/2017 | Yang .................. H01L 27/3209 |
| 2017/0207251 A1 | 7/2017 | Liu |
| 2017/0229524 A1 | 8/2017 | Tomida et al. |
| 2018/0233544 A1 | 8/2018 | Tomida et al. |
| 2018/0254305 A1 | 9/2018 | Tomida et al. |
| 2019/0140031 A1* | 5/2019 | Lamkin .............. H01L 51/0023 |
| 2019/0189596 A1* | 6/2019 | Chae .................. H01L 25/0753 |
| 2020/0075690 A1* | 3/2020 | Li ...................... H01L 27/3218 |

FOREIGN PATENT DOCUMENTS

| | | |
|---|---|---|
| CN | 101051158 A | 10/2007 |
| CN | 100424744 C | 10/2008 |
| CN | 101776826 A | 7/2010 |
| CN | 103441137 A | 12/2013 |
| CN | 204557029 U | 8/2015 |
| CN | 105487315 A | 4/2016 |
| CN | 107316873 A | 11/2017 |
| JP | 2010-2476 A | 1/2010 |

OTHER PUBLICATIONS

Office Action dated Jan. 18, 2021 in counterpart application CN 201910022041.3 (17 pages).

* cited by examiner

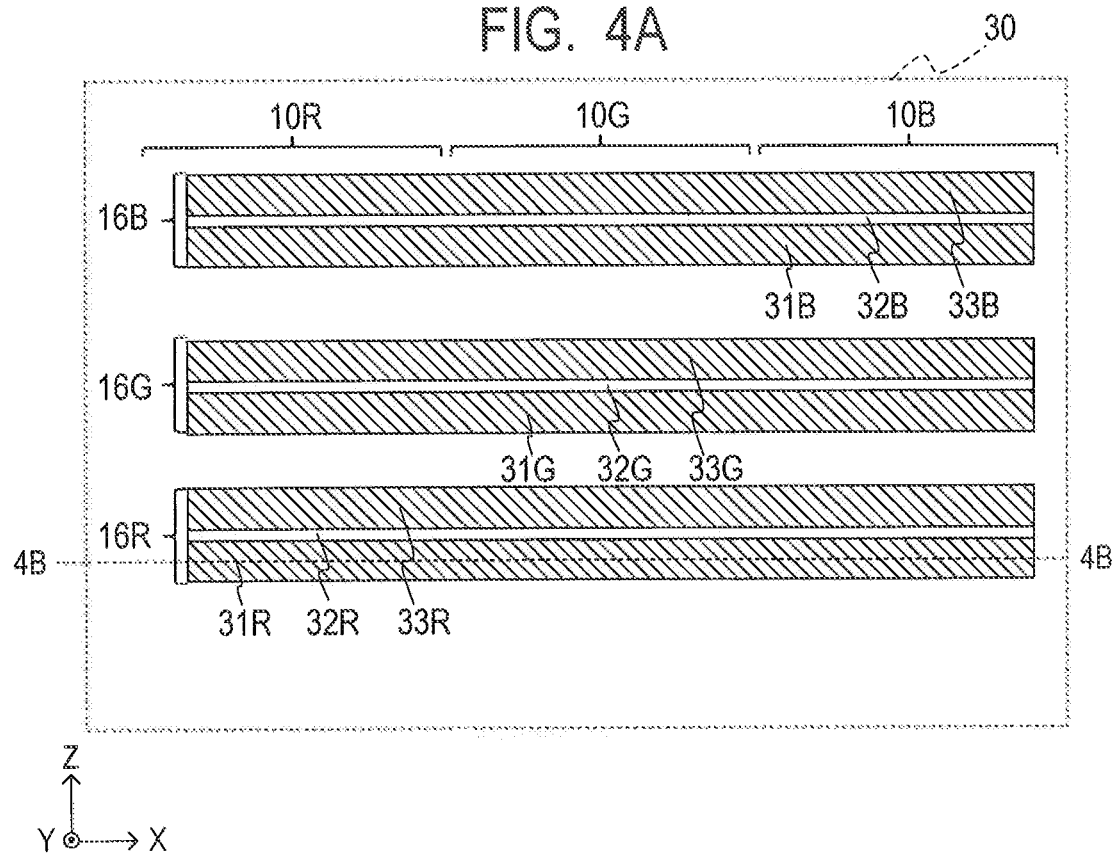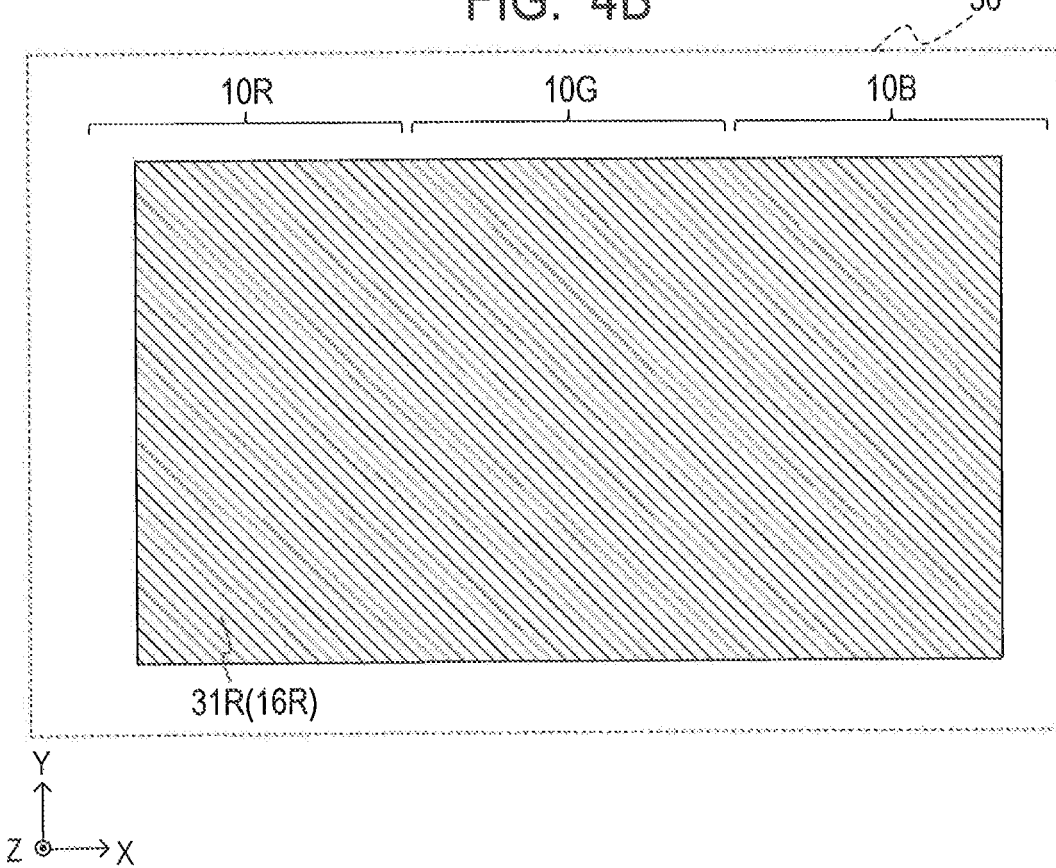

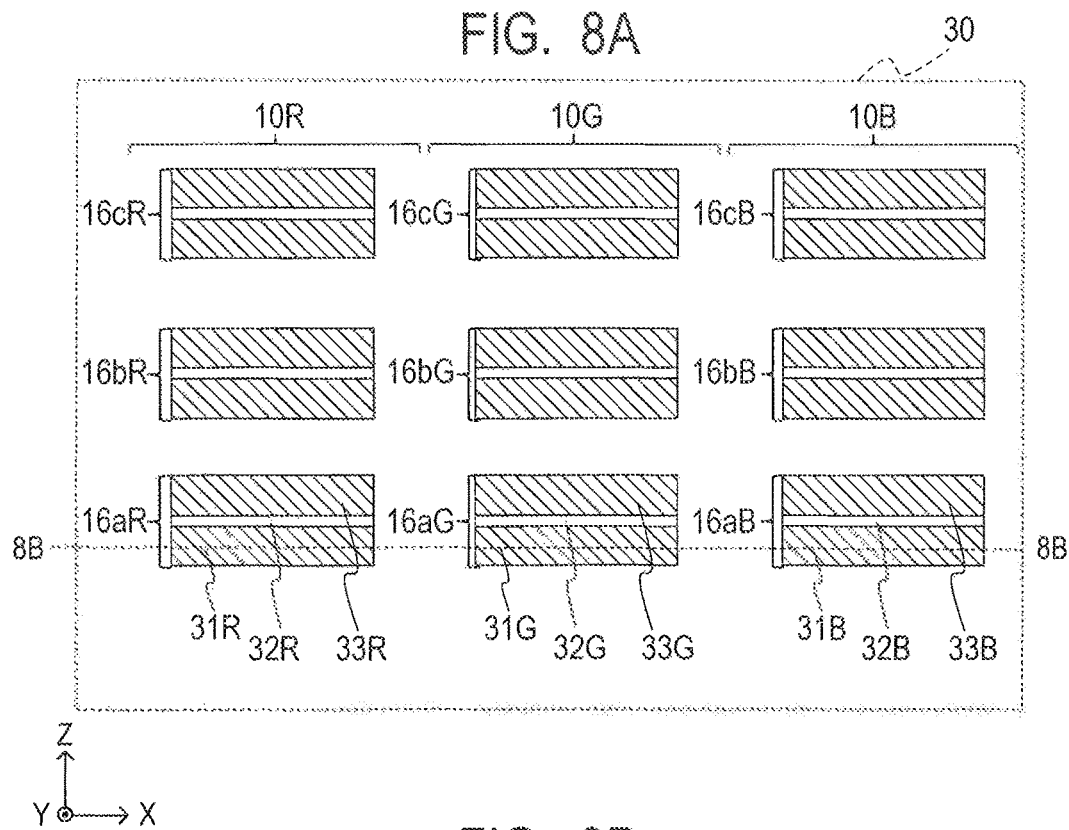
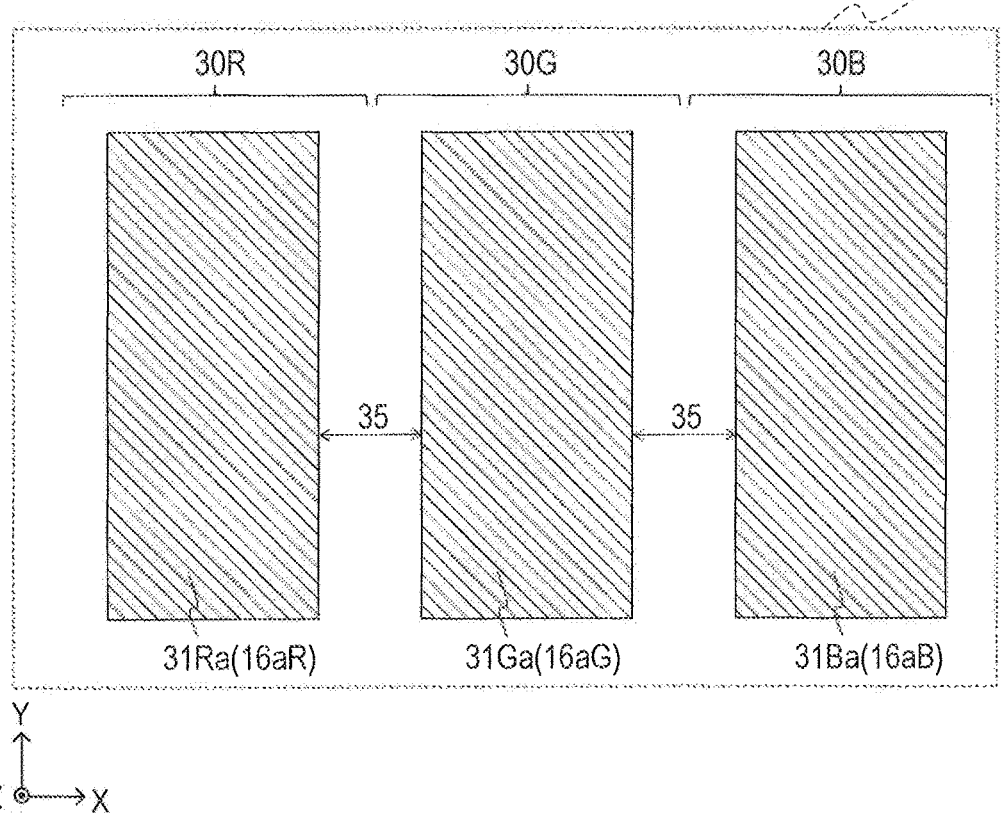

DISPLAY APPARATUS AND IMAGING APPARATUS

BACKGROUND

Field of the Disclosure

The present invention relates to a display apparatus and an imaging apparatus having the display apparatus.

Description of the Related Art

There is an active matrix type organic EL display apparatus that controls signals for video, which are supplied to display elements, by using transistors in pixels, as one example of an organic EL display apparatus having a self-luminous light-emitting device, in particular, an organic EL display apparatus that includes an organic electroluminescence element (hereinafter referred to as "organic EL element" in some cases) which is a current control element, as a light emitting device.

In the organic EL display apparatus, there is a scheme of separately applying organic EL materials of red (R), green (G) and blue (B) by vapor deposition while using a mask. In addition, there is a scheme of extracting each color light of RGB by combining an organic EL element that emits white light with color filters, instead of separately applying each of RGB organic EL materials.

According to Japanese Patent Application Laid-Open No. 2010-2476 (Patent Document 1), a display apparatus is structured so that a size of a pixel circuit element provided in each sub pixel is different among each sub pixel according to a required driving current, and a size of a capacitive element is also different among each of the sub pixels. The display apparatus is structured so as to suppress the increase in pattern defects due to dust or the like and improve a yield by preventing the pixel pattern density from increasing in a particular sub pixel.

In a current driven light-emitting device, the larger capacitance a capacitive element for maintaining the gate voltage of a transistor which is connected to the light emitting device, the better the capacitive element can suppress a voltage fluctuation of a pixel electrode during a light emitting period. If the voltage fluctuation of the pixel electrode can be suppressed, the display apparatus can suppress an increase in the amount of light emission, which is caused by the voltage fluctuation at low luminance levels. If an unexpected increase in the amount of light emission is suppressed, which occurs at low luminance levels, the contrast can be improved. In order to increase the capacitance of the capacitive element, it is acceptable to increase an area of the capacitive element, but when the capacitive element is provided in each sub pixel, the space at which the capacitive element can be arranged is limited. Therefore, if the capacitive element is separated into a plurality of layers for each sub pixel and the capacitive elements are electrically connected to each other, the capacitive element can increase the capacitance. However, because it is necessary to distinguish capacitive elements in each sub pixel by patterning the capacitive elements among sub pixels, the size of the capacitive element results in decreasing correspondingly to the space necessary for patterning.

SUMMARY

Accordingly, an object of the present invention is to provide a display apparatus that has sufficiently large capacity of a capacitive element provided in each sub pixel, suppresses a voltage fluctuation of a pixel electrode, and can suppress an increase in the amount of light emission due to the voltage fluctuation, which occurs at low luminance levels.

According to an aspect of the present invention, the display apparatus comprises a pixel that has a first sub pixel and a second sub pixel which emits a color different from that of the first sub pixel, on a substrate, wherein each of the first sub pixel and the second sub pixel includes a light-emitting device, a transistor connected to the light emitting device, and a capacitive element connected to the transistor, wherein the capacitive element of the first sub pixel and the capacitive element of the second sub pixel at least partially overlap each other.

Further features of the present invention will become apparent from the following description of exemplary embodiments with reference to the attached drawings.

BRIEF DESCRIPTION OF THE DRAWINGS

FIGS. 4A and 4B illustrate views for describing an arrangement relationship among capacitive elements in a pixel of the first embodiment.

FIGS. 8A and 8B illustrate views for describing an arrangement relationship among capacitive elements in a pixel of the comparative embodiment.

DESCRIPTION OF THE EMBODIMENTS

Preferred embodiments of the present invention will now be described in detail in accordance with the accompanying drawings.

First Embodiment

Preferable Embodiments of the display apparatus of the present invention will be described with reference to the drawings.

Figure 1:
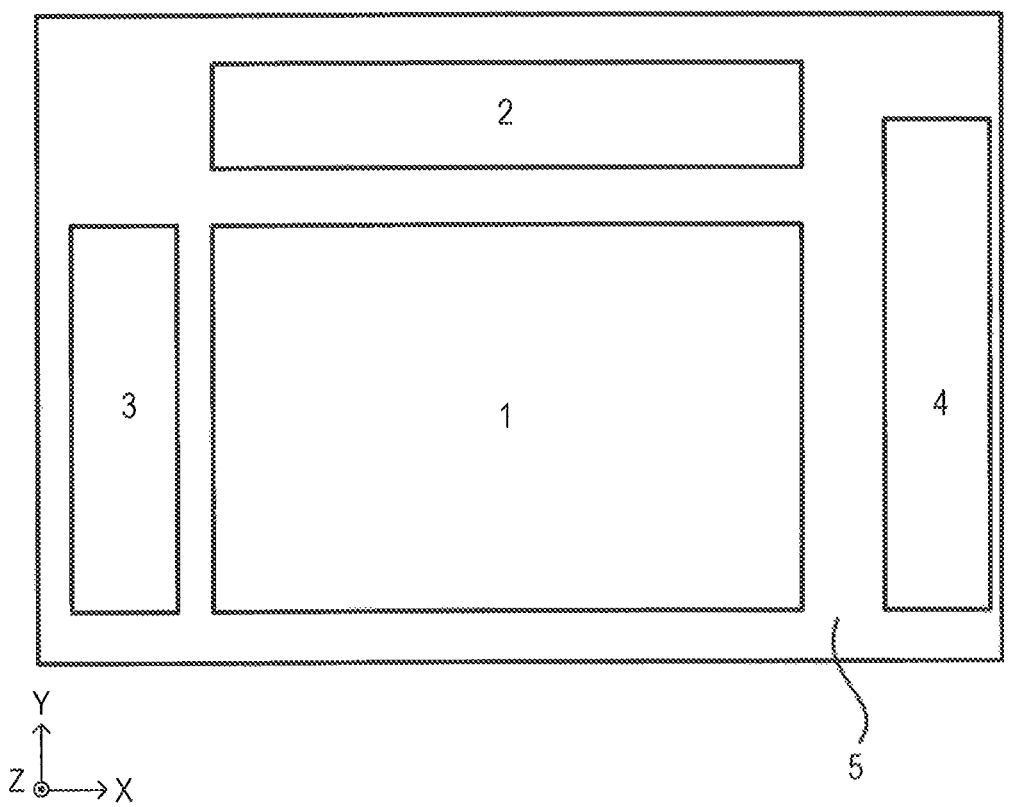
FIG. 1 illustrates an overall conceptual diagram illustrating a display apparatus of a first embodiment.

FIG. 1 illustrates an overall schematic diagram illustrating a display apparatus of the present embodiment. The display apparatus of FIG. 1 has a display region 1, a horizontal drive circuit 2, a vertical drive circuit 3 and a connection terminal unit 4, on a substrate 5. In the display region 1, a plurality of pixels are arranged in a form of a matrix. The pixels have each a plurality of sub pixels. The plurality of sub pixels each have a first sub pixel and a second sub pixel which emits a different color from that of the first sub pixel, and further can have each a third sub pixel which emits a different color from those of both of the first sub pixel and the second sub pixel. The horizontal drive circuit 2 is a circuit which outputs a data signal, and is connected to an output line. The vertical drive circuit 3 is a circuit which outputs a selection signal. The connection terminal unit 4 is a terminal which inputs a clock signal, an image data signal and the like to the horizontal drive circuit 2 and the vertical drive circuit 3, and is connected to the horizontal drive circuit 2 and the vertical drive circuit 3 by wires (unillustrated).

Each of the sub pixels has a current driven light-emitting device, a transistor for supplying an electric current to the light emitting device, and a capacitive element for maintaining a gate voltage of the transistor. The light emitting device which the sub pixel has may be an organic light-emitting device such as an organic electroluminescence device (organic EL device) which has a pair of electrodes and an organic compound layer arranged between the pair of electrodes. Examples of the pair of electrodes include an anode and a cathode.

The organic compound layer which the organic light-emitting device has may be formed of a single layer or a plurality of layers, as long as the organic compound layer has a light emitting layer. When the organic compound layer is formed of the plurality of layers, examples of the layers include a hole injection layer, a hole transporting layer, an electron blocking layer, a light emitting layer, a hole blocking layer, an electron transporting layer and an electron injecting layer.

The light emitting layer may be formed of a plurality of light emitting layers. When having the plurality of light emitting layers, the light emitting layer may come in contact with another light emitting layer. An intermediate layer may be provided between the light emitting layer and another light emitting layer.

The emission color of the light emitting layer is not limited in particular, but may be a white color due to light emissions of a plurality of light emitting layers. Combinations by which the light emitting layers emit white light include combinations of red, green and blue, combinations of blue and yellow or yellow-green, and the like. The yellow or the yellow-green may be formed by having both of red and green light emitting materials in the same light emitting layer.

In the case of the combination of the red, the green and the blue light emitting layers, an intermediate layer may be provided between the blue light emitting layer and another light emitting layer. More specifically, when the light emitting layers are arranged in order of red, blue and green from the anode side, an intermediate layer may be arranged between red and blue light emitting layers.

The light emitting device may have a protective layer on a pair of electrodes. The protective layer may be a plurality of layers. The protective layer may be formed by a CVD method, a sputtering method, an ALD method or the like. When the protective layer is formed of a plurality of layers, a plurality of production methods may be combined. For example, the first protective layer may be formed by the CVD method, and the second protective layer may be formed by the ALD method. Furthermore, the constituent materials of the plurality of protective layers may be different. Usable constituent materials of the protective layer include SiN, SiO, $Al_2O_3$ and SiON.

Figure 2:
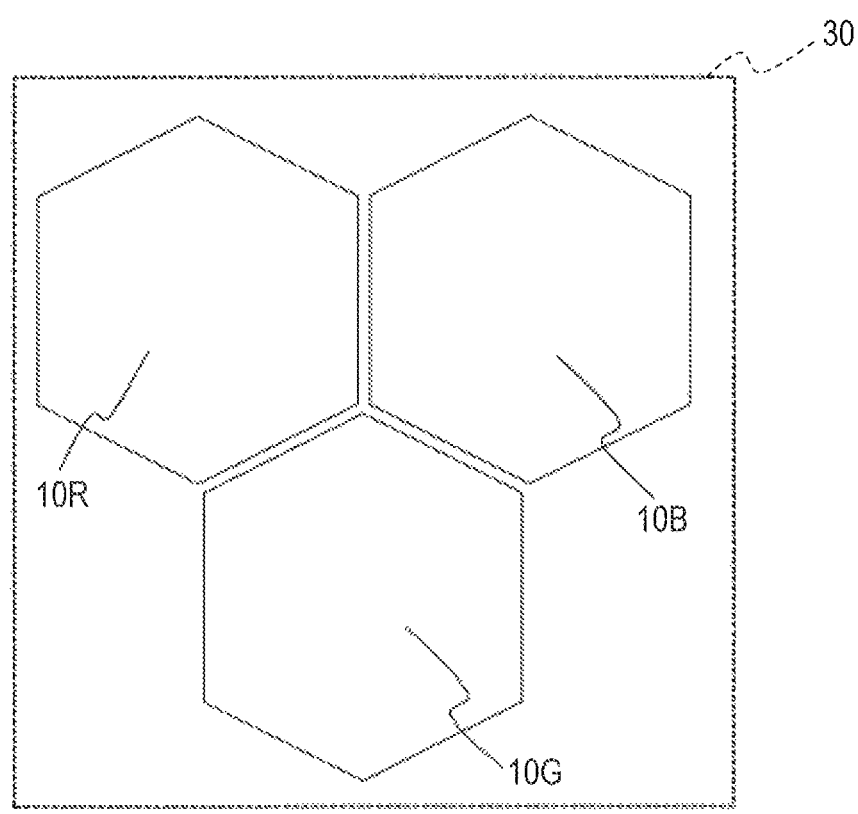
FIG. 2 illustrates a view illustrating a delta arrangement.

The light emitting device may further have a color filter. The color filter may be color filters of red, green and blue. The red, green and blue color filters may be arranged in any way, but can be a delta arrangement. The delta arrangement includes an arrangement illustrated in FIG. 2. In FIG. 2, a pixel 30 and sub pixels 10R, 10G and 10B are illustrated which emit colors of red (R), green (G) and blue (B), respectively.

Hereinafter, the case will be described as an example, where the light emitting device is an organic EL element and the pixel 30 has the sub pixels 10R, 10G and 10B which emit the respective colors of R, G and B, but the present invention is not limited to the present example.

Figure 3:
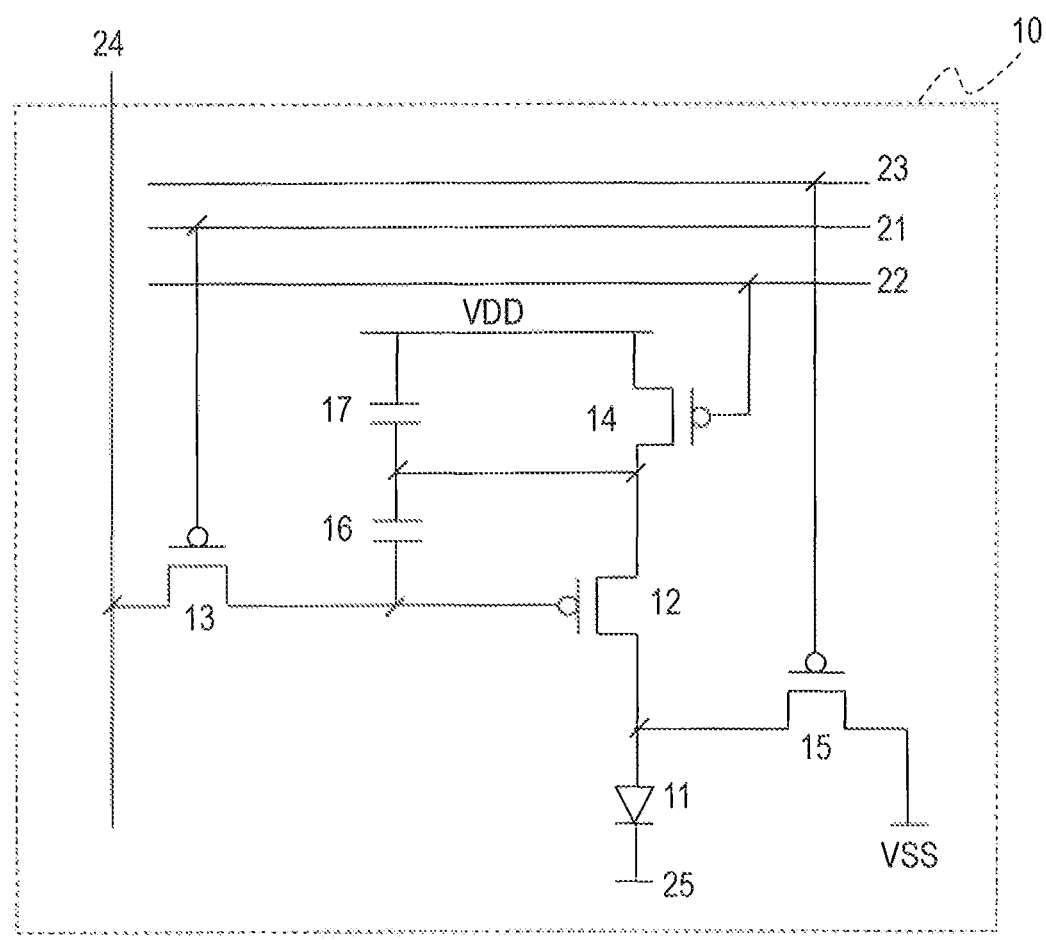
FIG. 3 illustrates an equivalent circuit diagram of a pixel circuit connected to a sub pixel of the first embodiment.

Firstly, a circuit connected to the sub pixel of the display apparatus of the present embodiment will be described with reference to FIG. 3. FIG. 3 illustrates an equivalent circuit diagram of the pixel circuit connected to the sub pixel. In FIG. 3, the sub pixel 10 includes a current driving type organic EL element 11 of which the light emission luminance changes according to a flowing current, and a driving circuit which drives the organic EL element 11.

In the organic EL element 11, the cathode electrode is connected to a common power source 25 wired in common with all of the sub pixels 10.

The driving circuit which drives the organic EL element 11 includes a driving transistor 12, a selection transistor 13, switching transistors 14 and 15, a first capacitive element 16 and a second capacitive element 17. A P-channel transistor is used for each of the driving transistor 12, the selection transistor 13, and the switching transistors 14 and 15.

The driving transistor 12 is a transistor which supplies an electric current to the light emitting device, and supplies a driving current to the organic EL element 11 by being connected to the organic EL element 11 in series. Specifically, a drain electrode of the driving transistor 12 is connected to an anode electrode (pixel electrode) of the organic EL element 11.

In the selection transistor 13, the gate electrode is connected to a scanning line 21, the source electrode is connected to a signal line 24, and the drain electrode is connected to the gate electrode of the driving transistor 12. To the gate electrode of the selection transistor 13, written signals are applied from the vertical drive circuit 3 through the scanning line 21.

In the switching transistor 14, the gate electrode is connected to the scanning line 22, the source electrode is connected to the first power supply potential VDD, and the drain electrode is connected to the source electrode of the driving transistor 12. To the gate electrode of the switching transistor 14, a signal for controlling luminescence is applied from the vertical drive circuit 3 through the scanning line 22. In the other switching transistor 15, the gate electrode is connected to the scanning line 23, the source electrode is connected to a second power supply potential VSS, and the drain electrode is connected to the anode electrode of the organic EL element 11. To the gate electrode of the switching transistor 15, a signal for controlling a potential of the anode electrode of the organic EL element 11 is applied from the vertical drive circuit 3 through the scanning line 23.

The first capacitive element 16 is a capacitive element which maintains the gate voltage of the transistor, and is connected to between the gate electrode and the source electrode of the driving transistor 12. The second capacitive element 17 is connected to between the source electrode of the driving transistor 12 and the first power supply potential VDD. In FIG. 3, both of the first capacitive element 16 and the second capacitive element 17 are each illustrated as one capacitive element, but it is acceptable to use different capacitive elements which are electrically connected in parallel, as one capacitive element.

The vertical drive circuit 3 to which the scanning lines 21, 22 and 23 are connected supplies signals sequentially row by row, thereby make the first capacitive element 16 of each of the sub pixels maintain the signal voltage and the reference voltage, and control the sub pixels so that the sub pixels emit light having luminance corresponding to the signal voltage.

In FIG. 3, a PMOS is used as a MOS transistor, but an NMOS may be used. In addition, the driving circuit is not limited to such a 4Tr2C circuit configuration as to include four transistors and two capacitive elements. In addition, a transistor formed on a silicon wafer may be used as the MOS transistor, or a thin film transistor formed on a glass substrate may be used.

In the sub pixel 10 having the above described configuration, the selection transistor 13 becomes a conductive state in response to a write signal which is applied from the vertical drive circuit 3 to the gate electrode through the scanning line 21. By this operation, the selection transistor 13 samples the signal voltage or the reference voltage corresponding to the luminance information and writes the voltages in the sub pixel 10. By applying the reference voltage, the vertical drive circuit 3 corrects the variation of threshold voltages of the driving transistors 12 in each of the sub pixels, and can reduce the variation of luminance of each of the sub pixels, which is caused by the variation of the threshold voltages. The written signal voltage or reference voltage is applied to the gate electrode of the driving transistor 12, and also is maintained by the first capacitive element 16.

The driving transistor 12 is designed so as to operate in a saturation region. The driving transistor 12 receives a supply of an electric current from the first power supply potential VDD via the switching transistor 14, and makes the organic EL element 11 emit light by the current drive. At this time, the amount of electric current flowing through the organic EL element 11 is determined according to the voltage maintained by the first capacitive element 16, and accordingly the driving transistor 12 can control the amount of light emission of the organic EL element 11.

The switching transistor 14 becomes a conductive state in response to a signal for controlling light emission, which is applied to the gate electrode from the vertical drive circuit 3 through the scanning line 22. Specifically, the switching transistor 14 has a function of controlling the luminescence and non-luminescence of the organic EL element 11.

The switching transistor 15 selectively supplies the second power supply potential VSS to the anode electrode of the organic EL element 11 in response to a signal for controlling the potential of the anode electrode, which is applied to the gate electrode from the vertical drive circuit 3 through the scanning line 23. Assuming that the common power source 25 connected to the cathode electrode of the organic EL element 11 is represented by Vcath and a threshold voltage of the organic EL element 11 is represented by Vthel, the second power source potential VSS is designed so as to satisfy the condition of VSS<Vcath+Vthel. Thereby, when the switching transistor 15 is in the conductive state, the VSS applies a reverse bias to the organic EL element 11, and can control the organic EL element 11 to the non-luminescent state.

Next, in order to describe an arrangement relationship among the capacitive elements in the pixel of the present embodiment, firstly, a display apparatus of a comparative embodiment will be described below.

Figure 7:
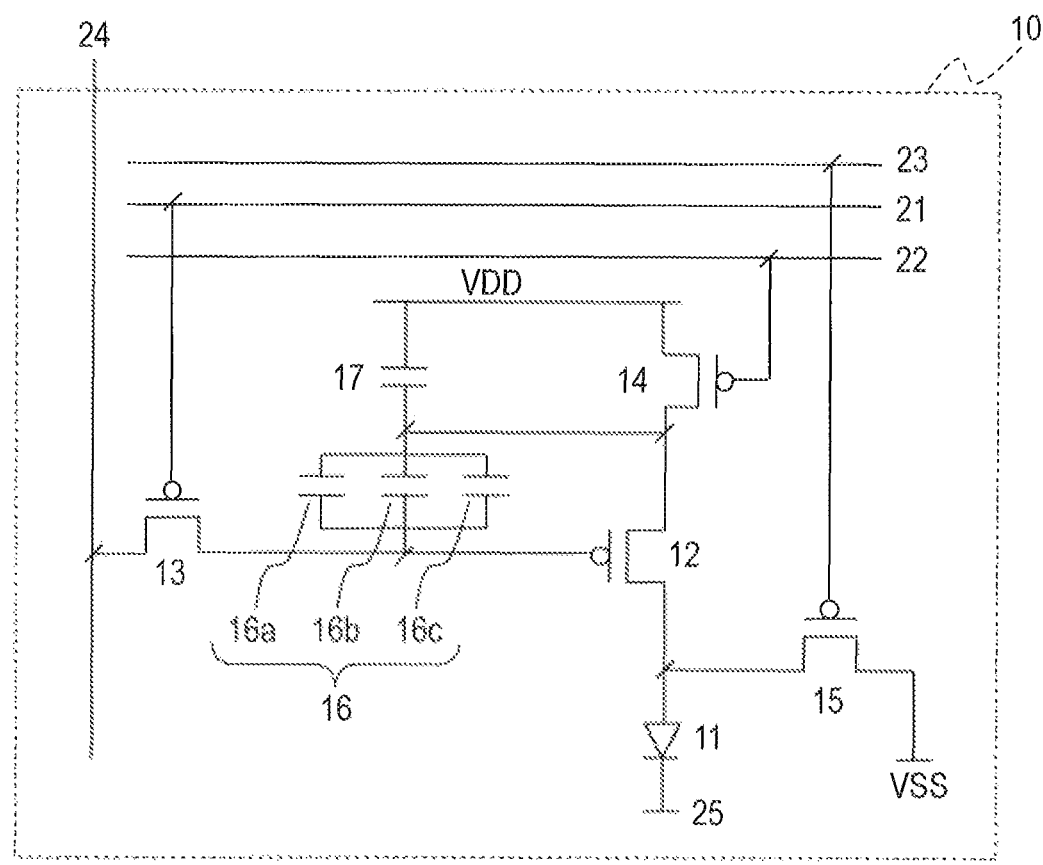
FIG. 7 illustrates an equivalent circuit diagram of a pixel circuit connected to a sub pixel of a display apparatus of a comparative embodiment.

FIG. 7 is an equivalent circuit diagram of a pixel circuit connected to a sub pixel of the display apparatus of the comparative embodiment. The difference from the pixel circuit illustrated in FIG. 3 is a point that the first capacitive element 16 is configured as a capacitive element in which a plurality of capacitive elements 16a, 16b and 16c are electrically connected in parallel.

FIGS. 8A and 8B are views for describing the arrangement relationship among the capacitive elements in the pixel of the comparative embodiment. FIG. 8A schematically illustrates a cross section of the first capacitive element 16 of the three sub pixels 10R, 10G and 10B of RGB in a pixel 30, and other elements in the pixel circuit are omitted. The cross section illustrated in FIG. 8A is a plane which is perpendicular to the substrate plane (XY plane) and is along the arrayed direction (X direction) of the sub pixels 10R, 10G and 10B, and an unillustrated substrate is positioned at a lower part of the page. FIG. 8B is a sectional view taken along line 8B-8B in FIG. 8A.

In FIG. 8A, a case of the R sub pixel 10R will be described. Capacitive elements 16aR, 16bR, and 16cR correspond to the capacitive elements 16a, 16b and 16c of FIG. 7, respectively. The capacitive element 16aR is a capacitive element having a stacked structure, which includes an insulating layer 32R stacked on the upper part of the lower electrode 31R, and an upper electrode 33R stacked on the upper part of the insulating layer 32R. The capacitive elements 16bR and 16cR having a similar structure are provided with the use of other wiring layers and insulating layers, and the capacitive elements 16aR, 16bR and 16cR in the R sub pixel 10R can be used as one capacitive element (first capacitive element 16) by being electrically connected in parallel. Also concerning a G sub pixel 10G and a B sub pixel 10B, similarly to the R sub pixel 10R, three capacitive elements 16a, 16b and 16c are electrically connected in parallel in each of the sub pixels 10, and constitute the first capacitive element 16.

In the comparative embodiment, the plurality of capacitive elements 16a, 16b and 16c which are stacked along a direction (Z direction) perpendicular to the substrate plane are connected in parallel in the sub pixel 10 with the use of different wiring layers and insulating layers, and thereby the capacity is increased in a limited planar space in the sub pixel 10.

However, it is necessary to electrically distinguish the capacitive elements of different sub pixels 10 from each other, and accordingly in the comparative embodiment, the size of the capacitive element results in being decreased by an amount for securing the space therefor. In the comparative embodiment, the capacitive elements of the different sub pixels 10 are electrically distinguished from each other by patterning wiring layers for forming the lower electrode 31 and the upper electrode 33. Specifically, as for the lower electrode 31, a space 35 is provided between the lower electrodes 31, in order to distinguish the capacitive elements of the different sub pixels 10 from each other, as illustrated in FIG. 8B. The arrangement of an upper electrode 32 is also similar, and as a result, the capacitive elements 16aR, 16aG and 16aB are electrically insulated from each other. When a pixel size decreases because of high definition, the size of the capacitive element decreases by the amount of a space necessary for patterning the capacitive element, and there is a limit in increasing the capacitance of the capacitive element.

Incidentally, the comparative embodiment has been described with reference to the first capacitive element 16, but all the capacitive elements using the wiring layer can be similarly described as in the above.

Next, the capacitive element in the pixel of the present embodiment will be described below with reference to FIGS. 4A and 4B.

FIGS. 4A and 4B illustrate views for describing an arrangement relationship among the capacitive elements in the pixel of the present embodiment. FIG. 4A schematically illustrates a cross section of the first capacitive element 16 of the three sub pixels 10R, 10G and 10B of RGB in the pixel 30, and other elements in the pixel circuit are omitted. The cross section illustrated in FIG. 4A illustrates a plane which is perpendicular to the substrate plane (XY plane) and is along the arrayed direction (X direction) of the sub pixels 10R, 10G and 10B, and an unillustrated substrate is positioned at a lower part of the page. FIG. 4B illustrates a sectional view taken along the line 4B-4B in FIG. 4A.

In FIG. 4A, a case of R sub pixel 10R will be described. A first capacitive element 16R corresponds to the first capacitive element 16 in FIG. 3. The first capacitive element 16R is a capacitive element having a stacked structure, which includes an insulating layer 32R stacked on the upper part of a lower electrode 31R, and an upper electrode 33R stacked on the upper part of the insulating layer 32R. The first capacitive elements 16G and 16B of a G sub pixel 10G and a B sub pixel 10B are also similar to the R sub pixel 10R.

The difference from the comparative embodiment is a point that the first capacitive elements 16 of the different sub pixels 10 overlap each other at least partially, can overlap each other totally, and specifically overlap when viewed from a direction (Z direction) perpendicular to a substrate plane. Specifically, the first capacitive element 16 is arranged so as to astride a planar region of another sub pixel 10, similarly to all in the R sub pixel 10R, the G sub pixel 10G and the B sub pixel 10B. In other words, a first capacitive element 16G of the G sub pixel 10G is stacked on the upper part of a first capacitive element 16R of the R sub pixel 10R, and a first capacitive element 16B of the B sub pixel 10B is stacked on the upper part of the capacitive element 16G of the G sub pixel 10G, so as to be electrically distinguished from each other, for example, by an insulating layer or the like.

In the present specification, to overlap can be also said to be stacked. In addition, to overlap also can mean that the capacitive element of the first sub pixel is arranged between the substrate and the capacitive element of the second sub pixel.

In the present embodiment, positions at which the first capacitive elements 16 are arranged are not partitioned by a planar area for each of the sub pixels 10, but are partitioned with the use of a plurality of layers; and regions in which the first capacitive elements 16 are arranged are shared among different sub pixels 10 in a plane direction (XY plane direction). Because of this, the display apparatus can reduce a space for electrically distinguishing the first capacitive elements 16 between the different sub pixels 10 in the planar direction, and accordingly can form a size of the first capacitive element 16 large which is provided in each of the sub pixels 10. If the capacity of the first capacitive element 16 increases, the resultant capacitive element 16 suppresses the voltage fluctuation of the pixel electrode, can prevent the amount of light emission from increasing due to the voltage fluctuation at low luminance levels, and can enhance the contrast.

In the present embodiment, the first capacitive elements 16 of the sub pixel 10 in the same pixel 30 are stacked so as to overlap each other planarly, and the first capacitive elements 16 of the sub pixels 10 of the different pixels 30 are electrically distinguished from each other by the patterning of the wiring layers, which forms the lower electrode 31 and the upper electrode 33. However, the sub pixels 10 which are stacked so as to planarly overlap each other are not limited to the sub pixels 10 in the same pixel 30, but, for example, the first capacitive elements 16 of the sub pixel 10 of the different pixels 30 may be stacked so as to planarly overlap each other. In addition, the order in which the first capacitive element 16 is stacked is not limited to the present embodiment, but, for example, the first capacitive element 16B may be arranged on the upper part of the first capacitive element 16R, and the first capacitive element 16G may be stacked on the upper part of the first capacitive element 162B.

The present embodiment has been described with reference to the first capacitive element 16, but all the capacitive elements using the wiring layer can be similarly described, and for example, the present embodiment may be applied to a second capacitive element 17. In addition, as in the comparative embodiment, it is acceptable to form a capacitive element which combines a structure in which capacitive elements in the same sub pixel are connected in parallel with each other, with a structure according to the present embodiment.

Second Embodiment

Figure 5:
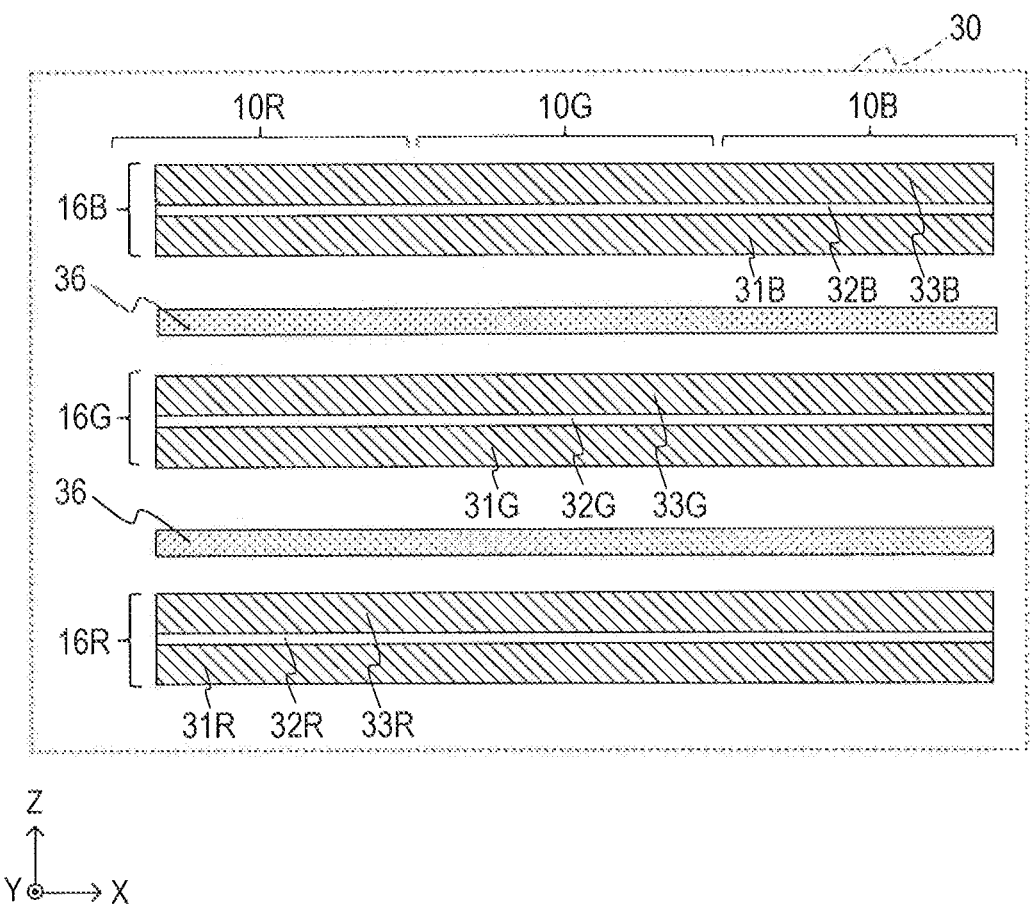
FIG. 5 illustrates a view for describing an arrangement relationship among capacitive elements in a pixel of a second embodiment.

The present embodiment will be described with reference to FIG. 5. FIG. 5 illustrates a view for describing an arrangement relationship among capacitive elements in a pixel of the present embodiment, and illustrates a cross section similar to FIG. 4A; and other elements in the pixel circuit are omitted similarly to that in FIG. 4A. The structure and description of the first embodiment can be similarly applied also to the present embodiment. The difference from the first embodiment of the present embodiment is that a conductive layer 36 is arranged between the first capacitive elements 16 of the different sub pixels 10.

In the present embodiment, the conductive layer 36 is arranged between the first capacitive element 16R and the first capacitive element 16G, and between the first capacitive element 16G and the first capacitive element 16B. Due to the conductive layer 36 being arranged between the first capacitive elements 16 of the different sub pixels 10, the display apparatus can suppress the capacitive coupling which occurs between the first capacitive elements 16, and can reduce crosstalk between the sub pixels 10. Because of this, the display apparatus can improve color reproducibility. It is desirable that the potential of the conductive layer 36 is fixed, and for example, the same potential as the second power supply potential VSS or the first power supply potential VDD can be supplied. The conductive layer 36 can be also referred to as a shield layer.

In the present embodiment, the conductive layer 36 is arranged not in a planar direction (XY plane direction) between the first capacitive elements 16 of the different sub pixels 10, but in a space in a direction (Z direction) perpendicular to the planar direction. Thereby the display apparatus can reduce the crosstalk without reducing an area of the first capacitive element 16.

Third Embodiment

Figure 6:
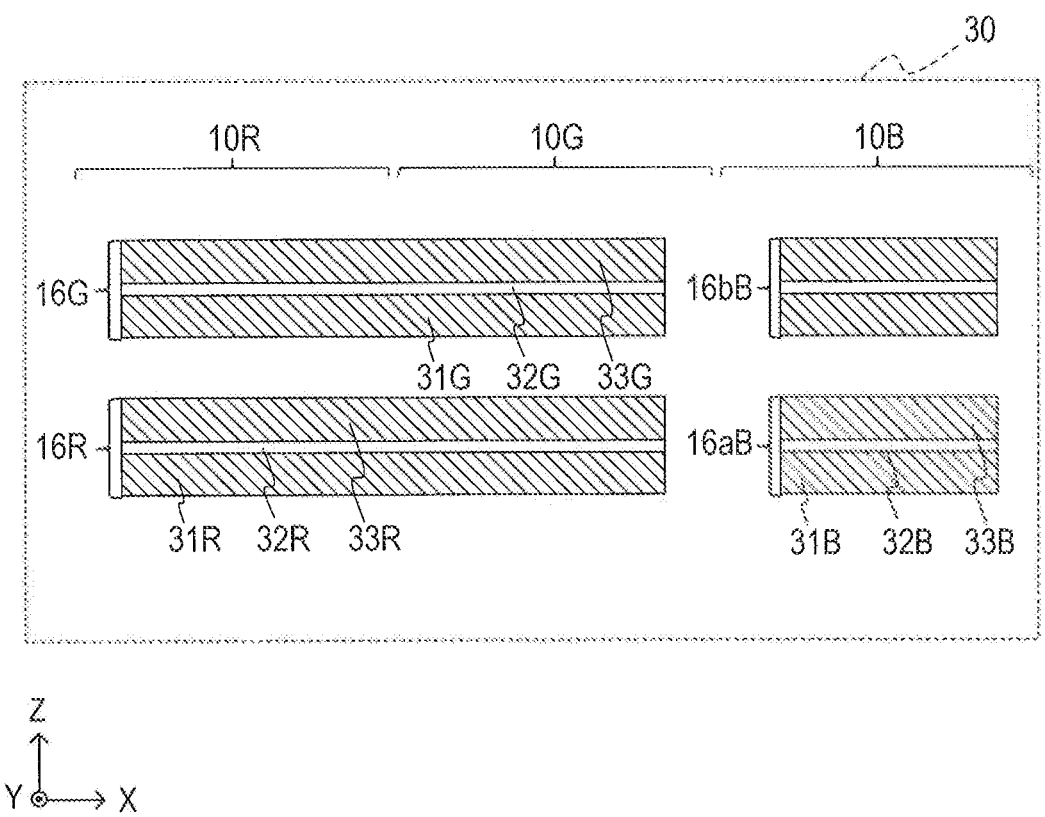
FIG. 6 illustrates a view for describing an arrangement relationship among capacitive elements in a pixel of a third embodiment.

The present embodiment will be described with reference to FIG. 6. FIG. 6 is a view for describing an arrangement relationship among capacitive elements in a pixel of the present embodiment, and illustrates a cross section similar to FIG. 4A; and other elements in the pixel circuit are omitted similarly to that in FIG. 4A. The structure and description of the first embodiment can be similarly applied also to the present embodiment. The difference from the first embodiment of the present embodiment is that such a relationship that the first capacitive elements 16 of the different sub pixels 10 are stacked so as to planarly overlap each other holds for only sub pixels 10 of particular colors.

In the present embodiment, only the first capacitive element 16R of the R sub pixel 10R and the first capacitive element 16G of the G sub pixel 10G are stacked so as to planarly overlap each other. In the first capacitive element 16B of the B sub pixel 10B, the capacitive elements 16aB and 16bB are electrically connected in parallel. Because of this, though in the first embodiment, the first capacitive element 16 is formed by three layers in the direction perpendicular to the planar direction (XY plane direction), in the present embodiment, the first capacitive element 16 can be formed by two layers, and the capacitive elements to be stacked are reduced. Accordingly, the number of steps for forming the first capacitive elements 16 can be reduced, and accordingly an effect of improving the yield can be obtained.

In the present embodiment, only the first capacitive element of the B sub pixel 10B is arranged so as not to planarly overlap the first capacitive elements 16R and 16G of the other sub pixels 10R and 10G, but the present embodiment is not limited to this combination, and the combination may be changed according to characteristics of the display element. For example, if it is necessary to increase the capacity of the first capacitive elements 16 of the G sub pixel 10G and the B sub pixel 10B as compared with the R sub pixel 10R, the first capacitive elements 16G and 16B of the G sub pixel 10G and the B sub pixel 10B may be stacked so as to planarly overlap each other.

The display apparatus of the present invention may be used for a display unit of a television, a PC monitor, a display unit inside an automobile, a display unit of a mobile terminal, a display unit of a smartphone, and a display unit of a tablet terminal.

[Imaging Apparatus]

The display apparatus of the present invention may be used for a display unit of an imaging apparatus. The imaging apparatus may include an optical system having a plurality of lenses, and an imaging device which receives light passing through the optical system. The display unit displays an image photographed by the imaging device.

The imaging apparatus may be a digital still camera, a network camera or the like. In the case, the display unit may be a back face display unit of a digital still camera, a view finder, or a display unit showing a photographed image of another camera and/or a state of the camera.

As described above, according to the present invention, the display apparatus can increase the capacity of the capacitive elements provided in each of the sub pixels, accordingly can suppress the voltage fluctuation of the pixel electrode, and can suppress an increase of the amount of light emission due to the voltage fluctuation at low luminance levels.

According to the present invention, the display apparatus can increase the capacity of the capacitive elements provided in each of the sub pixels, accordingly can suppress the voltage fluctuation of the pixel electrode, and can suppress the increase of the amount of light emission due to the voltage fluctuation at low luminance levels.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-001601, filed Jan. 10, 2018, which is hereby incorporated by reference herein in its entirety.

What is claimed is:

1. A display apparatus comprising a pixel that has a first sub pixel and a second sub pixel which emits a color different from that of the first sub pixel, on a substrate,
    wherein each of the first sub pixel and the second sub pixel comprises a light emitting device, a transistor connected to the light emitting device, and a capacitor connected to the transistor,
    wherein the capacitor of the first sub pixel and the capacitor of the second sub pixel are in a stacked configuration so as to at least partially overlap each other in a direction perpendicular to the largest surface of the substrate, and
    wherein, in a plan view, the capacitor of the first sub pixel overlaps the light emitting device of the first sub pixel and the second sub pixel.

2. The display apparatus according to claim 1, further comprising a conductive layer between the capacitor of the first sub pixel and the capacitor of the second sub pixel.

3. The display apparatus according to claim 1, wherein the pixel further comprises a third sub pixel that emits a color different from any of the first sub pixel and the second sub pixel,
    wherein the third sub pixel comprises a light emitting device, a transistor connected to the light emitting device, and a capacitor connected to the transistor, and
    wherein the capacitor of the third sub pixel is stacked with the capacitor of the first sub pixel and the capacitor of the second sub pixel so as to at least partially overlap with the capacitor of the first sub pixel and the capacitor of the second sub pixel in a direction perpendicular to the largest surface of the substrate.

4. The display apparatus according to claim 3, further comprising a conductive layer between the capacitor of the third sub pixel and the capacitor of the first sub pixel or the capacitor of the second sub pixel, in the direction perpendicular to the largest surface of the substrate.

5. The display apparatus according to claim 3, wherein, in the plan view, the capacitor of the first sub pixel overlaps the light emitting device of the third sub pixel.

6. The display apparatus according to claim 1, wherein each light emitting device is an organic light-emitting device that has a pair of electrodes and an organic compound layer arranged between the pair of electrodes.

7. The display apparatus according to claim 6, wherein the organic compound layer has a plurality of light emitting layers, and emits white light due to the plurality of light emitting layers.

8. The display apparatus according to claim 7, wherein each light emitting device further comprises a color filter.

9. The display apparatus according to claim 8, wherein the color filter comprises color filters of red, green and blue, and the color filters of the red, the green and the blue are delta arranged.

10. An imaging apparatus comprising: an optical system that has a plurality of lenses; an imaging device that receives light passing through the optical system; and a display unit that displays an image captured by the imaging device, wherein the display unit comprises the display apparatus according to claim 1.

11. The display apparatus according to claim 1, wherein the capacitor of the first sub pixel is arranged so as to be astride a planar region of the second sub pixel.

12. The display apparatus according to claim 1, wherein the light emitting device of the first sub pixel and the second sub pixel comprises a lower electrode, an upper electrode, and an organic layer disposed between the lower electrode and the upper electrode, respectively, and
    wherein, in the plan view, the capacitor of the first sub pixel overlaps the lower electrodes of the first sub pixel and the second sub pixel.

13. A display apparatus comprising a first light emitting device and a second light emitting device which emits a color different from a color of the first light emitting device, wherein the first light emitting device and the second light emitting device comprise a lower electrode, an upper electrode, an organic layer disposed between the lower electrode and the upper electrode, and a capacitor connected to the lower electrode, respectively, and wherein, in a plan view, the capacitor of the first light emitting device overlaps the lower electrode of the first light emitting device and the lower electrode of the second light emitting device.

14. The display apparatus according to claim 13, wherein the capacitor of the first light emitting device and the capacitor of the second light emitting device are in a stacked configuration so as to at least partially overlap each other in a direction perpendicular to the largest surface of the substrate.

15. The display apparatus according to claim 13, further comprising a third light emitting device which emits a color different from any of the first light emitting device and the second light emitting device, wherein the third light emitting device comprises a lower electrode, an upper electrode, an organic layer disposed between the lower electrode and the upper electrode, and a capacitor connected to the lower electrode, wherein the capacitor of the third light emitting device is stacked with the capacitor of the first light emitting device and the capacitor of the second light emitting device, in a direction perpendicular to the largest surface of the substrate, and wherein the capacitor of the first light emitting device overlaps the lower electrode of the third light emitting device.

16. An imaging apparatus comprising:

an optical system that has a plurality of lenses;

an imaging device that receives light passing through the optical system; and a display unit that displays an image captured by the imaging device, wherein the display unit comprises the display apparatus according to claim 13.

* * * * *